(12) United States Patent
Chen

(10) Patent No.: US 10,043,790 B2
(45) Date of Patent: Aug. 7, 2018

(54) DIODE DEVICE OF TRANSIENT VOLTAGE SUPPRESSOR AND MANUFACTURING METHOD THEREOF

(71) Applicant: UBIQ Semiconductor Corp., Zhubei, Hsinchu County (TW)

(72) Inventor: Chih-Hao Chen, Zhubei (TW)

(73) Assignee: UBIQ SEMICONDUCTOR CORP., Zhubei, Hsinchu County (TW)

( * ) Notice: Subject to any disclaimer, the term of this patent is extended or adjusted under 35 U.S.C. 154(b) by 41 days.

(21) Appl. No.: 15/138,346

(22) Filed: Apr. 26, 2016

(65) Prior Publication Data

US 2017/0221875 A1   Aug. 3, 2017

(30) Foreign Application Priority Data

Feb. 1, 2016   (TW) .............................. 105103173 A

(51) Int. Cl.

| | |
|---|---|
| *H01L 29/66* | (2006.01) |
| *H01L 27/02* | (2006.01) |
| *H01L 27/08* | (2006.01) |
| *H01L 29/06* | (2006.01) |
| *H01L 29/861* | (2006.01) |
| *H01L 29/866* | (2006.01) |

(52) U.S. Cl.
CPC ...... *H01L 27/0255* (2013.01); *H01L 27/0814* (2013.01); *H01L 29/0684* (2013.01); *H01L 29/66106* (2013.01); *H01L 29/66136* (2013.01); *H01L 29/861* (2013.01); *H01L 29/866* (2013.01)

(58) Field of Classification Search
CPC ............ H01L 27/0255; H01L 27/0814; H01L 29/66106; H01L 29/66136; H01L 29/866
See application file for complete search history.

(56) References Cited

U.S. PATENT DOCUMENTS

| 8,431,999 B2 | 4/2013 | Shen et al. | |
|---|---|---|---|
| 2007/0073807 A1* | 3/2007 | Bobde | H01L 29/407 709/203 |

(Continued)

FOREIGN PATENT DOCUMENTS

| TW | 201203507 A | 1/2012 |
|---|---|---|
| TW | 201322424 A | 6/2013 |

OTHER PUBLICATIONS

Office Action issued in corresponding Taiwan patent application dated Nov. 10, 2016.

*Primary Examiner* — Elias M Ullah
(74) *Attorney, Agent, or Firm* — McClure, Qualey & Rodack, LLP

(57) ABSTRACT

A diode device of a transient voltage suppressor (TVS) is disclosed. The diode device includes a substrate, a first well, a second well, a first electrode and a second electrode. The substrate has a first surface. The first well is formed in the substrate and near the first surface. The second well is formed in the substrate and near the first surface. There is a gap between the first well and the second well. The first electrode is electrically connected with the first well. The second electrode is electrically connected with the second well. A current path is formed from the first electrode, the first well, the substrate, the second well to the second electrode. The current path passes through a plurality of PN junctions to form an equivalent circuit having a plurality of equivalent capacitances coupled in series.

13 Claims, 8 Drawing Sheets

(56) References Cited

U.S. PATENT DOCUMENTS

2012/0012973 A1    1/2012  Chuang et al.
2014/0363930 A1*  12/2014  Bobde .................. H01L 29/866
                                                            438/133

* cited by examiner

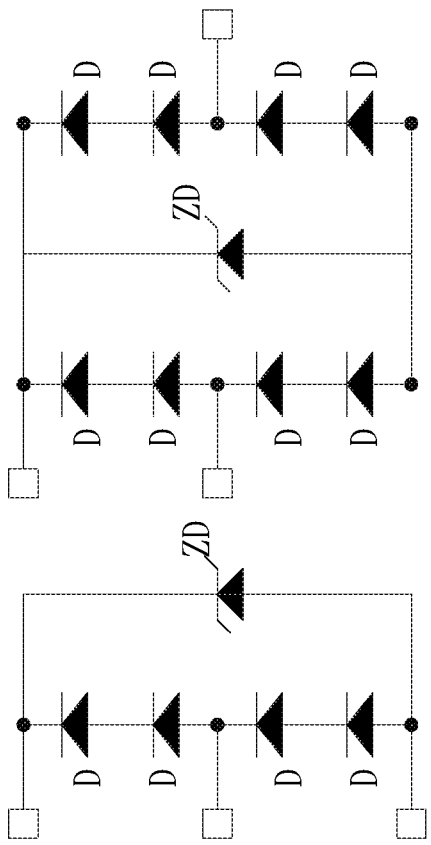
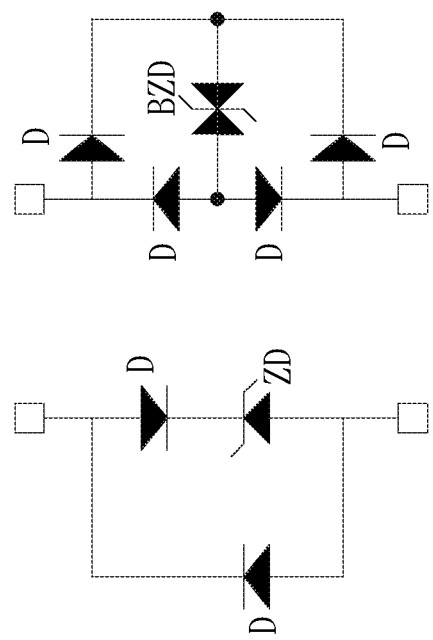
FIG. 1A (PRIOR ART)
FIG. 1B (PRIOR ART)
FIG. 2A (PRIOR ART)
FIG. 2B (PRIOR ART)

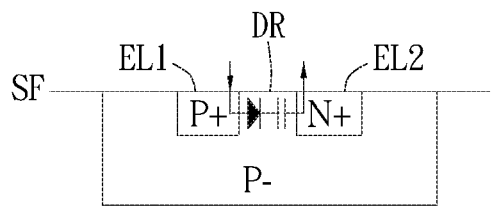
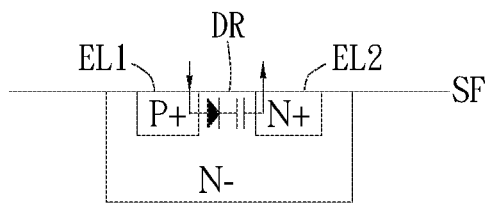
FIG. 3A
(PRIOR ART)
FIG. 3B
(PRIOR ART)
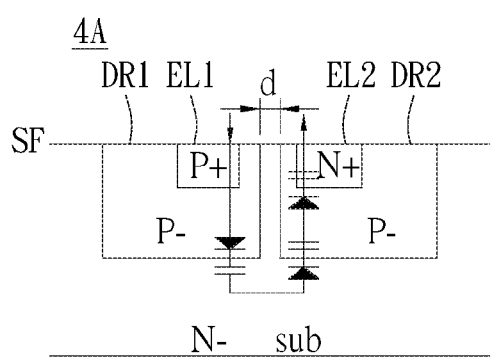
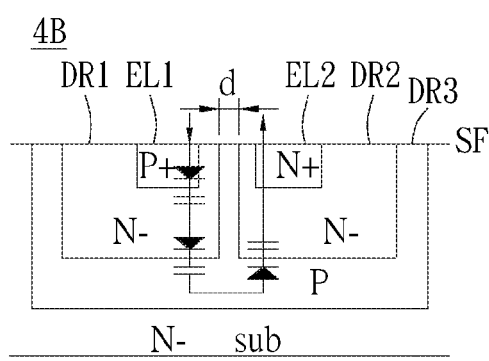
FIG. 4A
FIG. 4B
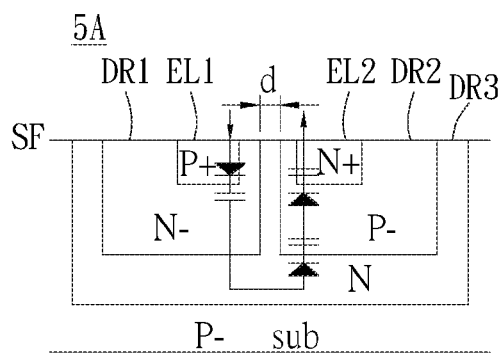
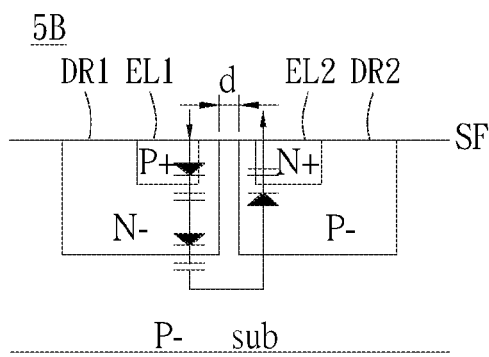
FIG. 5A
FIG. 5B

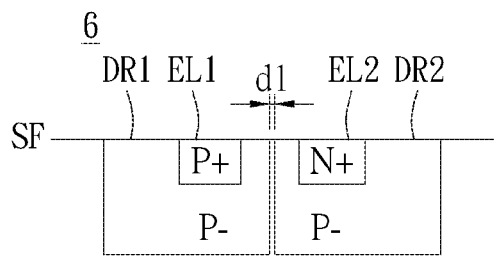
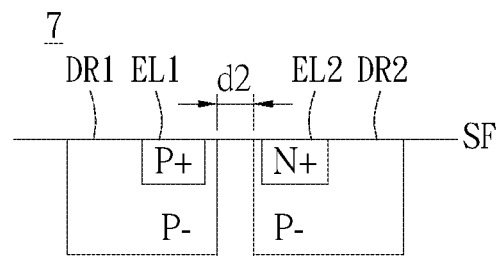
FIG. 6
FIG. 7
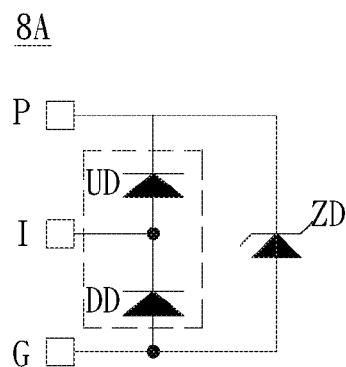
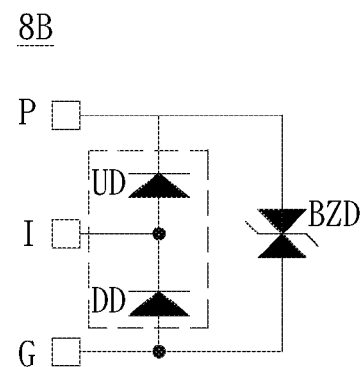
FIG. 8A
FIG. 8B

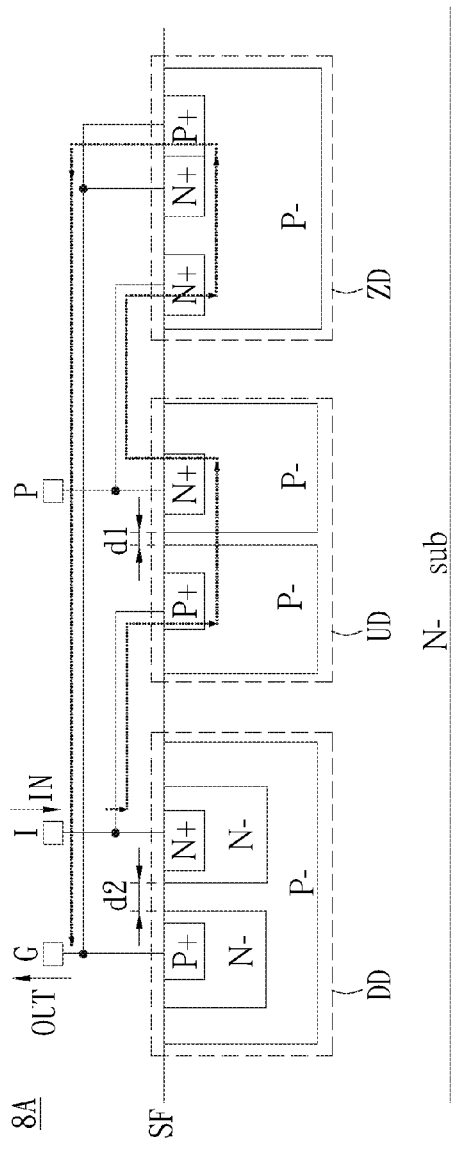
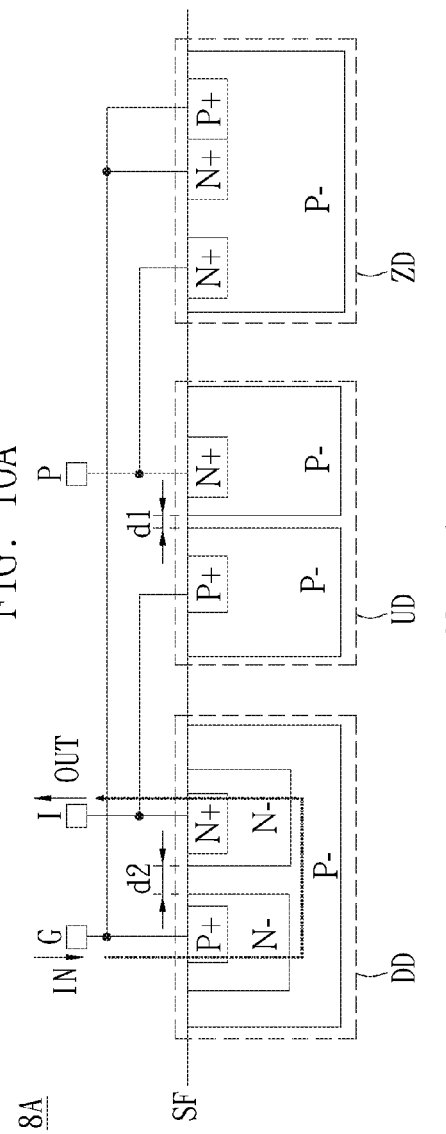
FIG. 10A
FIG. 10B

DIODE DEVICE OF TRANSIENT VOLTAGE SUPPRESSOR AND MANUFACTURING METHOD THEREOF

BACKGROUND OF THE INVENTION

1. Field of the Invention

The invention relates to transient voltage suppression; in particular, to a diode device of a transient voltage suppressor (TVS) and a manufacturing method thereof.

2. Description of the Prior Art

Because the transient voltage suppressor (TVS) needs to conduct high current in a short time, PN junctions having large area are necessary in the TVS. However, the PN junctions having large area will cause high parasitic capacitance and slow operation rate.

In order to reduce the parasitic capacitance and enhance the operation rate, the diode D having small capacitance is conventionally coupled in series on the path of the single-directional Zener diode ZD or bi-directional Zener diode BZD to reduce the capacitance of the TVS, as shown in FIG. 1A~FIG. 1B. FIG. 1A and FIG. 1B illustrate schematic diagrams of the conventional low-capacitance single-channel single-directional TVS and low-capacitance single-channel bi-directional TVS.

Although the entire capacitance of the TVS can be effectively reduced, the diode D having small capacitance also has small area; the TVS will have poor electrostatic discharge (ESD) and surge protection capability limited by this diode D having small area and fail to bear the energy having great power. Therefore, if the area of the diode D is increased to bear the energy having great power, more diodes D coupled in series are necessary to reduce the capacitance, as shown in FIG. 2A~FIG. 2B. FIG. 2A and FIG. 2B illustrate schematic diagrams of the conventional low-capacitance multi-channel single-directional TVS and low-capacitance multi-channel bi-directional TVS.

FIG. 3A and FIG. 3B illustrate schematic diagrams of two different laminated structures of the conventional diode having the N-type substrate and the equivalent capacitance on the current path in the diode.

However, once the number of the diodes D coupled in series is increased, the on-resistance (Ron) will also become larger; therefore, the TVS will have poor ESD and surge protection capability. This drawback needs to be overcome.

SUMMARY OF THE INVENTION

Therefore, the invention provides a diode device of a TVS and a manufacturing method thereof to solve the above-mentioned problems occurred in the prior arts.

An embodiment of the invention is a diode device of a TVS. In this embodiment, the diode device includes a substrate, a first well, a second well, a first electrode and a second electrode. The substrate has a first surface. The first well is formed in the substrate and near the first surface. The second well is formed in the substrate and near the first surface. There is a gap between the first well and the second well. The first electrode is electrically connected with the first well. The second electrode is electrically connected with the second well. A current path is formed from the first electrode, the first well, the substrate, the second well to the second electrode. The current path passes through a plurality of PN junctions to form an equivalent circuit having a plurality of equivalent capacitances coupled in series.

In an embodiment, the gap ranges between 1 um and 10 um.

In an embodiment, at least a part of the first electrode is disposed in the first well.

In an embodiment, the first electrode is disposed out of the first well.

In an embodiment, the first well and the second well include a first conductive material and the substrate includes a second conductive material; the first well, the second well and the substrate form the plurality of PN junctions.

In an embodiment, the first well and the second well have the same conductive type.

In an embodiment, the first well and the second well have different conductive types.

Another embodiment of the invention is also a diode device of a TVS. In this embodiment, the diode device includes a substrate, a deep well, a first well, a second well, a first electrode and a second electrode. The substrate with first conductive type has a first surface. The deep well with second conductive type is formed in the substrate and near the first surface. The first well is formed in the deep well and near the first surface. The second well is formed in the deep well and near the first surface. There is a gap between the first well and the second well. The first electrode with first conductive type is electrically connected with the first well. The second electrode with second conductive type is electrically connected with the second well. A current path is formed from the first electrode, the first well, the deep well, the second well to the second electrode. The current path passes through a plurality of PN junctions to form an equivalent circuit having a plurality of equivalent capacitances coupled in series.

Still another embodiment of the invention is a method of manufacturing a diode device of a TVS. In this embodiment, the method includes steps of: providing a substrate with first conductive type; forming a first well and a second well in the substrate, wherein there is a gap between the first well and the second well; forming a first electrode with first conductive type in the substrate and the first electrode and the first well are electrically connected; and forming a second electrode with second conductive type in the substrate and the second electrode and the second well are electrically connected, wherein doping concentrations of the first electrode and the second electrode are higher than doping concentrations of the first well and the second well.

Compared to the prior arts, the invention changes the structure of the diode coupled in series to the Zener diode in the TVS and the wells originally connected will be separated by a gap, so that the parasitic capacitance of the diode can be reduced and the ESD and surge protection capability can be maintained. In addition, different gaps between the wells in the invention can be selected based on different doping concentrations and manufacturing parameters to determine the type of the diode coupled in series to the Zener diode in the TVS.

The advantage and spirit of the invention may be understood by the following detailed descriptions together with the appended drawings.

BRIEF DESCRIPTION OF THE APPENDED DRAWINGS

FIG. 1A and FIG. 1B illustrate schematic diagrams of the conventional low-capacitance single-channel single-directional TVS and low-capacitance single-channel bi-directional TVS.

FIG. 2A and FIG. 2B illustrate schematic diagrams of the conventional low-capacitance multi-channel single-directional TVS and low-capacitance multi-channel bi-directional TVS.

FIG. 3A and FIG. 3B illustrate schematic diagrams of two different laminated structures of the conventional diode having the N-type substrate and the equivalent capacitance on the current path in the diode.

FIG. 4A and FIG. 4B illustrate schematic diagrams of the laminated structure of the low-capacitance diode of the TVS and the equivalent capacitance on the current path in the low-capacitance diode in an embodiment of the invention.

FIG. 5A and FIG. 5B illustrate schematic diagrams of the laminated structure of the low-capacitance diode of the TVS and the equivalent capacitance on the current path in the low-capacitance diode in another embodiment of the invention.

FIG. 6 illustrates a schematic diagram of a small gap d1 between the wells DR1 and DR2 and when the transient voltage passes through this structure, the wells will be conducted due to diffusion to form a punch-through diode.

FIG. 7 illustrates a schematic diagram of a large gap d2 between the wells DR1 and DR2 and when the transient voltage passes through this structure, the wells are not conducted even they are diffused to form a thyristor.

FIG. 8A and FIG. 8B illustrate schematic diagrams of the low-capacitance multi-channel single-directional TVS and low-capacitance multi-channel bi-directional TVS in the invention.

FIG. 10A and FIG. 10B illustrate the forward direction current path and the reverse direction current path of the low-capacitance multi-channel single-directional TVS of FIG. 8A.

DETAILED DESCRIPTION OF THE INVENTION

Figure 9:
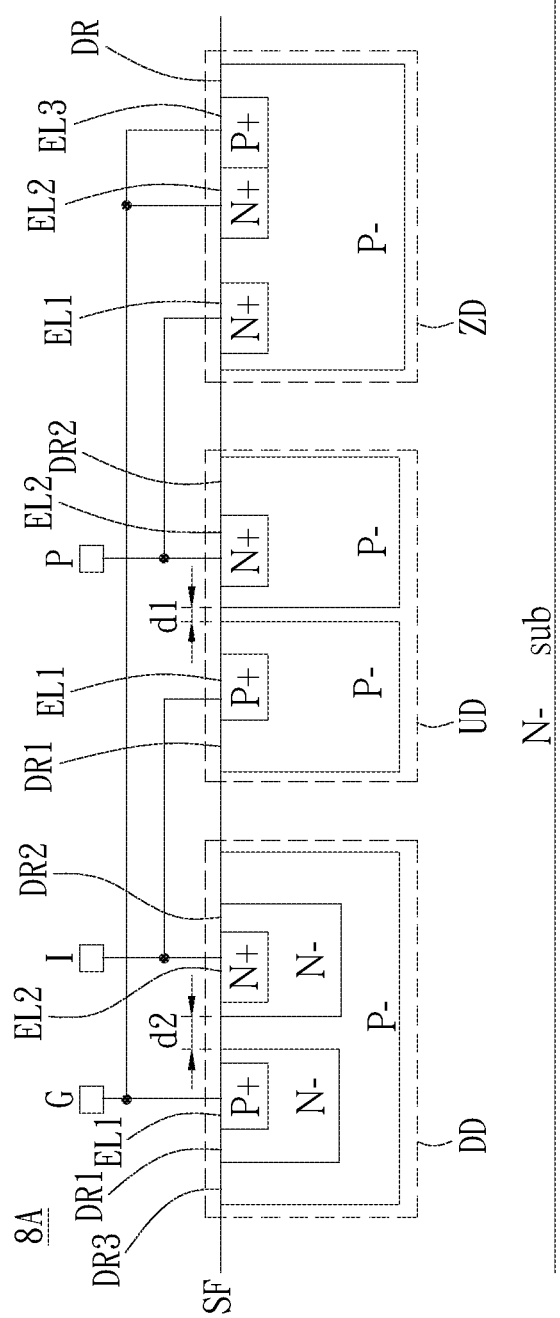
FIG. 9 illustrates a schematic diagram of the laminated structure of the low-capacitance multi-channel single-directional TVS.

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts. In the following embodiments, if the doping concentration of an element is higher than that of another element, the subjects compared are doping concentrations of the same conductive type.

Please refer to FIG. 4A and FIG. 4B. FIG. 4A and FIG. 4B illustrate schematic diagrams of two different laminated structures of the low-capacitance diode of the TVS respectively.

As shown in FIG. 4A, the diode 4A includes a substrate sub with a first conductive type (e.g., N-type) material, wells DR1~DR2 with a second conductive type (e.g., P-type) material, a P-type heavily-doped region (e.g., EL1) used as input electrode and a N-type heavily-doped region (e.g., EL2) used as output electrode. The substrate sub has a surface SF. The wells DR1~DR2 are formed in the substrate sub and near the surface SF of the substrate sub. The input electrode EL1 is electrically connected with the well DR1 and the output electrode EL2 is electrically connected with the well DR2. The input electrode EL1 and the output electrode EL2 are adjacent to the surface SF of the substrate sub. There is a gap d between the wells DR1 and DR2 and the wells DR1 and DR2 are not electrically connected. In practical applications, the gap d between the wells DR1 and DR2 can range from 1 um to 10 um, but not limited to this.

It should be noticed that a current path will be formed from the input electrode EL1, the well DR1, the substrate sub, the well DR2 to the output electrode EL2 and the current path will pass through a plurality of PN junctions to form an equivalent circuit having a plurality of equivalent capacitances coupled in series.

In this embodiment, the current path passes through the PN junction between the well DR1 and the substrate sub, the PN junction between the substrate sub and the well DR2 and the PN junction between the well DR2 and the electrode EL2 in order and each PN junction has an equivalent capacitance; therefore, an equivalent circuit having three equivalent capacitances coupled in series can be formed.

In practical applications, the wells DR1 and DR2 can be formed in the same manufacturing process and the wells DR1 and DR2 can have the same conductive type. For example, the wells DR1 and DR2 can be both P-type or the wells DR1 and DR2 can be both N-type. The doping concentrations of the electrodes EL1~EL2 will be higher than the doping concentrations of the wells DR1~DR2.

Similarly, as shown in FIG. 4B, the diode 4B includes a substrate sub with a first conductive type (e.g., N-type) material, wells DR1~DR2 with the first conductive type (e.g., N-type) material, a deep well DR3 with a second conductive type (e.g., P-type) material, a P-type heavily-doped region (e.g., EL1) used as input electrode and a N-type heavily-doped region (e.g., EL2) used as output electrode. The substrate sub has a surface SF. The deep well DR3 is formed in the substrate sub and near the surface SF of the substrate sub. The N-type well DR1 is formed in the deep well DR3 and near the surface SF of the substrate sub; the N-type well DR2 is formed in the deep well DR3 and near the surface SF of the substrate sub. The input electrode EL1 is electrically connected with the well DR1 and the output electrode EL2 is electrically connected with the well DR2. The input electrode EL1 and the output electrode EL2 are adjacent to the surface SF of the substrate sub. There is a gap d between the wells DR1 and DR2 and the wells DR1 and DR2 are not electrically connected. In practical applications, the gap d between the wells DR1 and DR2 can range from 1 um to 10 um, but not limited to this.

It should be noticed that a current path will be formed from the input electrode EL1, the well DR1, the deep well DR3, the well DR2 to the output electrode EL2 and the current path will pass through a plurality of PN junctions to form an equivalent circuit having a plurality of equivalent capacitances coupled in series.

In this embodiment, the current path passes through the PN junction between the input electrode EL1 and the well DR1, the PN junction between the well DR1 and the deep well DR3 and the PN junction between the deep well DR3 and the well DR2 in order and each PN junction has an equivalent capacitance; therefore, an equivalent circuit having three equivalent capacitances coupled in series can be formed.

In practical applications, the wells DR1 and DR2 can be formed in the same manufacturing process and the wells DR1 and DR2 can have the same conductive type. For example, the wells DR1 and DR2 can be both P-type or the wells DR1 and DR2 can be both N-type. The doping concentrations of the electrodes EL1~EL2 will be higher than the doping concentrations of the wells DR1~DR2 and the deep well DR3. In addition, the conductive type of the deep well DR3 is different from that of the substrate sub and the wells DR1~DR2; that is to say, when the conductive type of the substrate sub and the wells DR1~DR2 is a first conductive type (e.g., N-type), the conductive type of the deep well DR3 should be a second conductive type (e.g., P-type).

Please refer to FIG. 5A and FIG. 5B. FIG. 5A and FIG. 5B illustrate schematic diagrams of two different laminated structures of the low-capacitance diode of the TVS in another embodiment.

In this embodiment, the wells DR1 and DR2 have different conductive types. As shown in FIG. 5A, the diode 5A includes a substrate sub with a second conductive type (e.g., P-type) material, a deep well DR3 with a first conductive type (e.g., N-type) material, a N-type well DR1, a P-type well DR2, a P-type heavily-doped region (e.g., EL1) used as input electrode and a N-type heavily-doped region (e.g., EL2) used as output electrode. The substrate sub has a surface SF. The N-type well DR1 is formed in the substrate sub and near the surface SF of the substrate sub; the P-type well DR2 is formed in the substrate sub and near the surface SF of the substrate sub. The input electrode EL1 is electrically connected with the N-type well DR1 and the output electrode EL2 is electrically connected with the P-type well DR2. The input electrode EL1 and the output electrode EL2 are adjacent to the surface SF of the substrate sub. There is a gap d between the wells DR1 and DR2 and the wells DR1 and DR2 are not electrically connected. In practical applications, the gap d between the N-type well DR1 and the P-type DR2 can range from 1 um to 10 um, but not limited to this.

It should be noticed that a current path will be formed from the input electrode EL1, the well DR1, the substrate sub, the well DR2 to the output electrode EL2 and the current path will pass through a plurality of PN junctions to form an equivalent circuit having a plurality of equivalent capacitances coupled in series.

In this embodiment, the current path passes through the PN junction between the input electrode EL1 and the well DR1, the PN junction between the deep well DR3 and the well DR2 and the PN junction between the well DR2 and the electrode EL2 in order and each PN junction has an equivalent capacitance; therefore, an equivalent circuit having three equivalent capacitances coupled in series can be formed.

Similarly, as shown in FIG. 5B, the diode 5B includes a substrate sub with a second conductive type (e.g., P-type) material, a well DR1 with a first conductive type (e.g., N-type) material, a well DR2 with the second conductive type (e.g., P-type) material, a P-type heavily-doped region (e.g., EL1) used as input electrode and a N-type heavily-doped region (e.g., EL2) used as output electrode. The substrate sub has a surface SF. The wells DR1 and DR2 are formed in the substrate sub and near the surface SF of the substrate sub. The input electrode EL1 is electrically connected with the well DR1 and the output electrode EL2 is electrically connected with the well DR2. The input electrode EL1 and the output electrode EL2 are adjacent to the surface SF of the substrate sub. There is a gap d between the wells DR1 and DR2 and the wells DR1 and DR2 are not electrically connected. In practical applications, the gap d between the N-type well DR1 and the P-type DR2 can range from 1 um to 10 um, but not limited to this.

It should be noticed that different gaps d between the wells DR1 and Dr2 in the invention can be selected based on different doping concentrations and manufacturing parameters to determine which type of semiconductor device this diode is equivalent to, such as punch-through diode or thyristor, when the transient voltage passes through this diode, but not limited to this.

For example, as shown in FIG. 6, there is a small gap d1 (e.g., 1 um) between the wells DR1 and DR2. When a transient voltage passes through the semiconductor device 6, the wells DR1 and DR2 will be diffused outward and the gap d1 will become smaller. At last, the wells DR1 and DR2 will be electrically connected, so that the semiconductor device 6 will become a punch-through diode, but not limited to this. As shown in FIG. 7, there is a larger gap d2 (e.g., 10 um) between the wells DR1 and DR2. When a transient voltage passes through the semiconductor device 7, the wells DR1 and DR2 will be diffused outward and the gap d2 will become smaller. However, since the gap d2 is large enough, the wells DR1 and DR2 fail to be electrically connected, so that the semiconductor device 6 will become a thyristor such as a silicon control rectifier (SCR), but not limited to this.

Then, please refer to FIG. 8A and FIG. 8B. FIG. 8A and FIG. 8B illustrate schematic diagrams of the low-capacitance multi-channel single-directional TVS and low-capacitance multi-channel bi-directional TVS in the invention.

As shown in FIG. 8A, the low-capacitance multi-channel single-directional TVS 8A includes a single-directional zener diode ZD and low-capacitance diodes UD and DD coupled in series. Two terminals of the single-directional zener diode ZD are coupled to the pins P and G respectively; two terminals of the low-capacitance diode UD are coupled to the pin P and the low-capacitance diode DD respectively; two terminals of the low-capacitance diode DD are coupled to the low-capacitance diode UD and the pin G; the pin I is coupled between the low-capacitance diodes UD and DD.

As shown in FIG. 8B, the low-capacitance multi-channel bi-directional TVS 8B includes a bi-directional zener diode BZD and low-capacitance diodes UD and DD coupled in series. Two terminals of the bi-directional zener diode BZD are coupled to the pins P and G respectively; two terminals of the low-capacitance diode UD are coupled to the pin P and the low-capacitance diode DD respectively; two terminals of the low-capacitance diode DD are coupled to the low-capacitance diode UD and the pin G; the pin I is coupled between the low-capacitance diodes UD and DD.

Then, FIG. 9 is taken as an embodiment to illustrate the laminated structure of the low-capacitance multi-channel single-directional TVS 8A of FIG. 8A.

As shown in FIG. 9, the single-directional zener diode ZD and the low-capacitance diodes UD and DD are all formed in the N-type substrate sub. The pin G is coupled to the single-directional zener diode ZD and the low-capacitance diode DD respectively; the pin I is coupled to the low-capacitance diodes UD and DD; the pin P is coupled to the low-capacitance diode UD and the single-directional zener diode ZD.

In this embodiment, the single-directional zener diode ZD includes a well DR and electrodes EL1~EL3 formed in the well DR, wherein the electrodes EL2 and EL3 are electrically connected and separately disposed from the electrode EL1.

The low-capacitance diode UD includes wells DR1 and DR2 separately disposed and electrodes EL1 and EL2 electrically connected with the wells DR1 and DR2 respectively, wherein the electrode EL2 and the well DR2 have different conductive types; there is a gap d1 between the wells DR1 and DR2.

The low-capacitance diode DD includes a deep well DR3, wells DR1 and DR2 separately disposed in the deep well DR3 and electrodes EL1 and EL2 electrically connected with the wells DR1 and DR2 respectively, wherein the well DR1 and the deep well DR3 have different conductive types and the well DR2 and the deep well DR3 have different conductive types. The electrode EL1 and the well DR1 have different conductive types; there is a gap d2 between the wells DR1 and DR2.

From FIG. 9, it can be found that the pin G is coupled to the electrodes EL2 and EL3 electrically connected in the single-directional zener diode ZD and the electrode EL1 in the low-capacitance diode DD respectively; the pin I is coupled to the electrode EL1 in the low-capacitance diode UD and the electrode EL2 in the low-capacitance diode DD respectively; the pin P is coupled to the electrode EL2 in the low-capacitance diode UD and the electrode EL1 in the single-directional zener diode ZD respectively.

Then, FIG. 10A and FIG. 10B are used to illustrate the forward direction current path and the reverse direction current path of the low-capacitance multi-channel single-directional TVS 8A of FIG. 9.

As shown in FIG. 9 and FIG. 10A, for the low-capacitance multi-channel single-directional TVS 8A, the forward direction current path means that the input current IN enters into the low-capacitance multi-channel single-directional TVS 8A through the pin I and at last the output current OUT is outputted by the pin G. After the input current IN enters into the low-capacitance diode UD, the input current IN will pass through the electrode EL1, the well DR1, the N-type substrate sub, the well DR2 and the electrode EL2 of the low-capacitance diode UD in order and enter into the single-directional zener diode ZD, and then it will pass through the electrode EL1, the well DR and the electrode EL3 of the single-directional zener diode ZD in order and then the pin G will output the output current OUT. That is to say, in the forward direction current path of the low-capacitance multi-channel single-directional TVS 8A in this embodiment, the electrode EL1 of the low-capacitance diode UD is used as electrical input terminal and the electrode EL3 of the single-directional zener diode ZD is used as electrical output terminal, but not limited to this.

As shown in FIG. 9 and FIG. 10B, for the low-capacitance multi-channel single-directional TVS 8A, the reversed direction current path means that the input current IN enters into the low-capacitance multi-channel single-directional TVS 8A through the pin G and at last the output current OUT is outputted by the pin I. After the input current IN enters into the low-capacitance diode DD, the input current IN will pass through the electrode EL1, the well DR1, the deep well DR3, the well DR2 and the electrode EL2 of the low-capacitance diode DD in order and then the pin I will output the output current OUT. That is to say, in the reversed direction current path of the low-capacitance multi-channel single-directional TVS 8A in this embodiment, the electrode EL1 of the low-capacitance diode DD is used as electrical input terminal and the electrode EL2 of the low-capacitance diode DD is used as electrical output terminal, but not limited to this.

Figure 11:
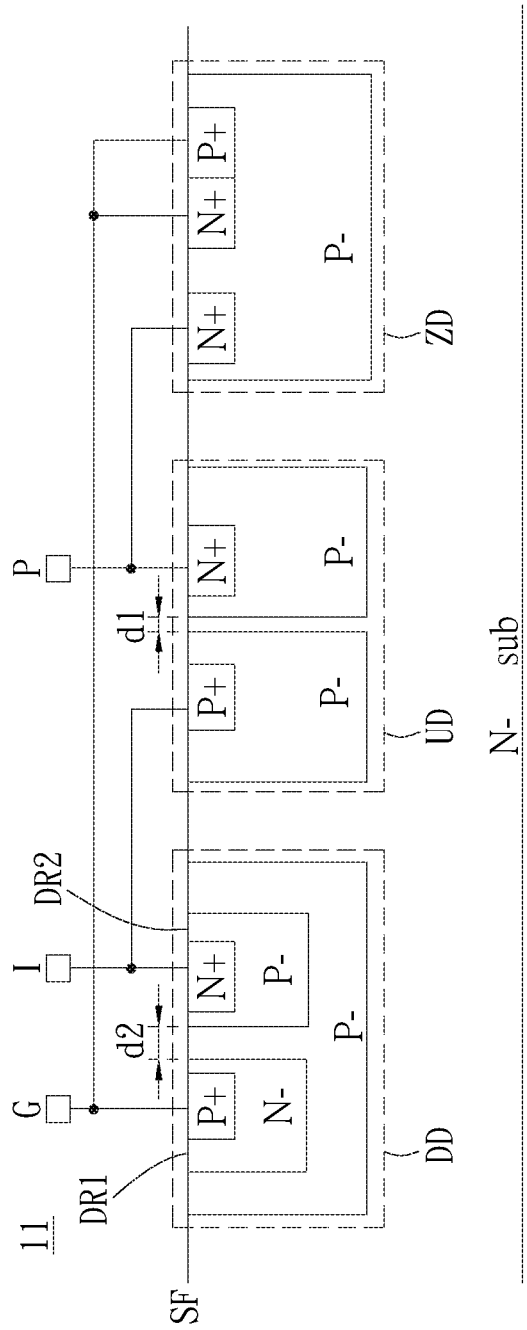
FIG. 11 illustrates a schematic diagram of the wells DR1 and DR2 having different conductive types.

It should be noticed that except the embodiment that the wells DR1 and DR2 in the low-capacitance diode DD have the same conductive type shown in FIG. 9, FIG. 11 illustrates another embodiment that the wells DR1 and DR2 in the low-capacitance diode DD of the low-capacitance multi-channel TVS 11 have different conductive types. That is to say, there is a gap between the wells DR1 and DR2 in the low-capacitance diode of the TVS of the invention and the wells DR1 and DR2 can have the same conductive type or different conductive types without specific limitations.

Figure 12A:
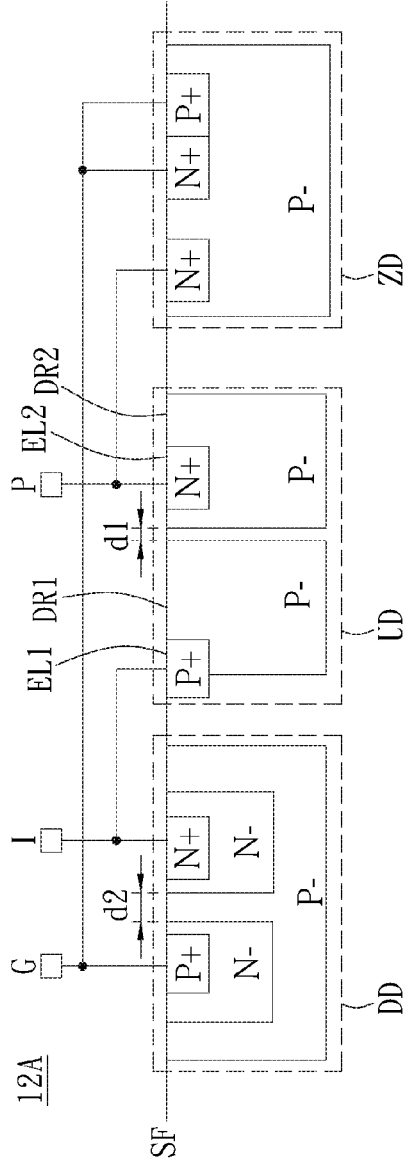
FIG. 12A illustrates a schematic diagram of a part of the electrode EL1 of the low-capacitance diode UD being disposed in the well DR1 and electrically connected with the well DR1.
Figure 12B:
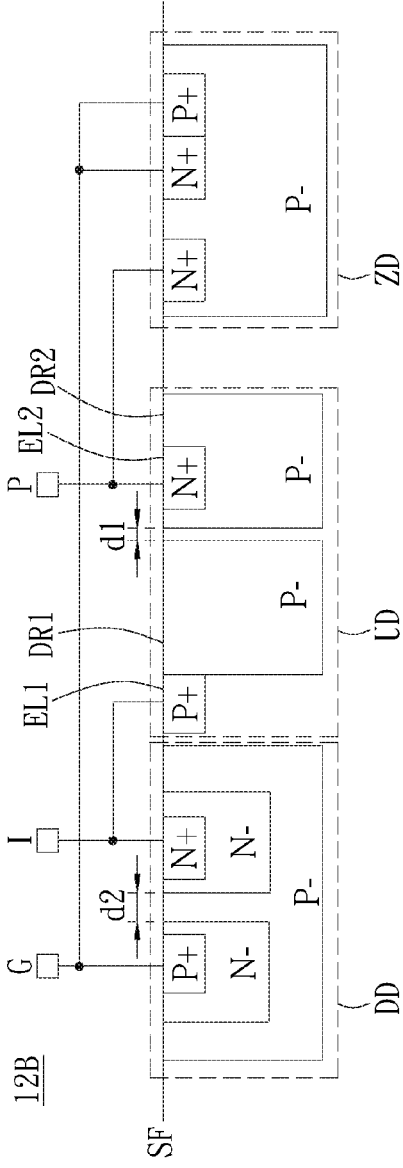
FIG. 12B illustrates a schematic diagram of the electrode EL1 of the low-capacitance diode UD being disposed out of the well DR1 and electrically connected with the well DR1.

In addition, except the embodiment that the electrode EL1 of the low-capacitance diode UD is formed in the well DR1 shown in FIG. 9, FIG. 12A illustrates an embodiment that only a part of the electrode EL1 of the low-capacitance diode UD of the low-capacitance multi-channel TVS 12A is disposed in the well DR1 and electrically connected with the well DR1 and FIG. 12B illustrates an embodiment that the electrode EL1 of the low-capacitance diode UD of the low-capacitance multi-channel TVS 12B is disposed out of the well DR1 and electrically connected with the well DR1. That is to say, the electrode EL1 and the well DR1 (or the electrode EL2 and the well DR2) in the low-capacitance diode of the low-capacitance multi-channel TVS of the invention can be electrically connected in any types, such as the electrode EL1 formed in the well DR1 (or the electrode EL2 formed in the well DR2), a part of the electrode EL1 disposed in the well DR1 and another part of the electrode EL1 disposed out of the well DR1 (or a part of the electrode EL2 disposed in the well DR2 and another part of the electrode EL2 disposed out of the well DR2), or the electrode EL1 disposed out of the well DR1 and electrically connected with the well DR1 (the electrode EL2 disposed out of the well DR2 and electrically connected with the well DR2), without any specific limitations.

Figure 13:
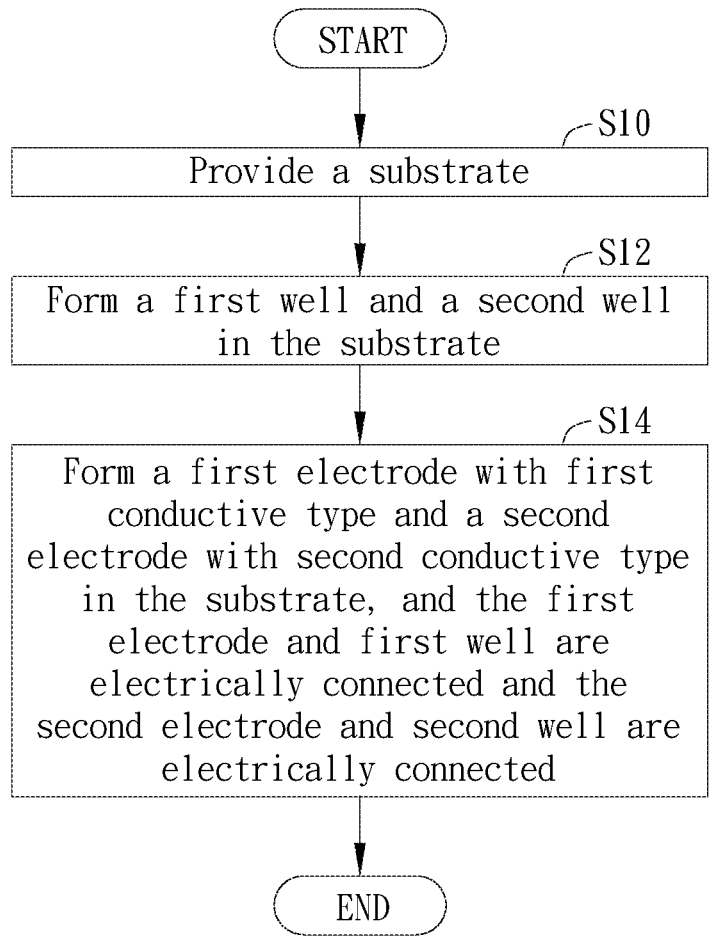
FIG. 13 illustrates a flowchart of the manufacturing method of the diode device of the TVS in another embodiment of the invention.

Another embodiment of the invention is a method of manufacturing a diode device of a TVS. As shown in FIG. 13, at first, in the step S10, the method provides a substrate; then, in the step S12, the method forms a first well and a second well in the substrate, and there is a gap between the first well and the second well.

In practical applications, it is preferred that the gap between the first well and the second well ranges between 1 um and 10 um, but not limited to this. In addition, the first well and the second well can be formed in the same manufacturing process and the first well and the second well have the same conductive type, or the first well and the second well can be formed in different manufacturing processes and the first well and the second well have different conductive types, but not limited to this.

Then, in the step S14, the method forms a first electrode with first conductive type and a second electrode with second conductive type in the substrate, wherein the first electrode and the first well are electrically connected and the second electrode and the second well are electrically connected. It should be noticed that doping concentrations of the first electrode and the second electrode are higher than doping concentrations of the first well and the second well.

In an embodiment, between the steps S10 and S12, the method can further includes the step of: forming a deep well in the substrate and forming the first well and the second well in the deep well, wherein the conductive type of the deep well is different from that of the substrate, the first well and the second well.

Compared to the prior arts, the invention changes the structure of the diode coupled in series to the Zener diode in the TVS and the wells originally connected will be separated by a gap, so that the parasitic capacitance of the diode can be reduced and the ESD and surge protection capability can be maintained. In addition, different gaps between the wells in the invention can be selected based on different doping concentrations and manufacturing parameters to determine the type of the diode coupled in series to the Zener diode in the TVS.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A diode device of a transient voltage suppressor (TVS), comprising:
   a substrate having a first surface;
   a first well formed in the substrate and near the first surface;
   a second well formed in the substrate and near the first surface, wherein there is a gap between the first well and the second well and only the substrate is disposed in the gap;
   a first heavily-doped region electrically connected with the first well and used as a first electrode; and
   a second heavily-doped region electrically connected with the second well and used as a second electrode,
   wherein a current path is formed from the first electrode, the first well, the substrate, the second well to the second electrode; the current path passes through a plurality of PN junctions to form an equivalent circuit having a plurality of equivalent capacitances coupled in series.

2. The diode device of claim 1, wherein the gap ranges between 1 um and 10 um.

3. The diode device of claim 1, wherein at least a part of the first electrode is disposed in the first well.

4. The diode device of claim 1, wherein the first electrode is disposed out of the first well.

5. The diode device of claim 1, wherein the first well and the second well comprise a first conductive material and the substrate comprises a second conductive material; the first well, the second well and the substrate form the plurality of PN junctions.

6. The diode device of claim 1, wherein the first well and the second well have the same conductive type.

7. The diode device of claim 1, wherein the first well and the second well have different conductive types.

8. A diode device of a transient voltage suppressor (TVS), comprising:
   a substrate with first conductive type having a first surface;
   a deep well with second conductive type formed in the substrate and near the first surface;
   a first well formed in the deep well and near the first surface;
   a second well formed in the deep well and near the first surface, wherein there is a gap between the first well and the second well and only the deep well is disposed in the gap;
   a first heavily-doped region with first conductive type electrically connected with the first well and used as a first electrode; and
   a second heavily-doped region with second conductive type electrically connected with the second well and used as a second electrode,
   wherein a current path is formed from the first electrode, the first well, the deep well, the second well to the second electrode; the current path passes through a plurality of PN junctions to form an equivalent circuit having a plurality of equivalent capacitances coupled in series.

9. The diode device of claim 8, wherein the gap ranges between 1 um and 10 um.

10. The diode device of claim 8, wherein at least a part of the first electrode is disposed in the first well.

11. The diode device of claim 8, wherein the first electrode is disposed out of the first well.

12. The diode device of claim 8, wherein the first well and the second well have the same conductive type.

13. The diode device of claim 8, wherein the first well and the second well have different conductive types.

* * * * *